United States Patent
Nishimura

(10) Patent No.: US 7,463,485 B1
(45) Date of Patent: Dec. 9, 2008

(54) CIRCUIT BOARD HOUSING AND CIRCUIT BOARD ASSEMBLY

(75) Inventor: Takeshi Nishimura, Santa Clara, CA (US)

(73) Assignee: Yamaichi Electronics U.S.A., Inc., San Jose, CA (US)

( * ) Notice: Subject to any disclaimer, the term of this patent is extended or adjusted under 35 U.S.C. 154(b) by 75 days.

(21) Appl. No.: 11/585,555

(22) Filed: Oct. 23, 2006

Related U.S. Application Data

(60) Provisional application No. 60/731,617, filed on Oct. 28, 2005.

(51) Int. Cl.
*H05K 7/20* (2006.01)
(52) U.S. Cl. ............... 361/699; 361/689; 361/692; 257/714; 165/104.33; 174/15.1
(58) Field of Classification Search ............... None
See application file for complete search history.

(56) References Cited

U.S. PATENT DOCUMENTS

| | | | | |
|---|---|---|---|---|
| 4,399,484 A | * | 8/1983 | Mayer | 361/689 |
| 4,546,412 A | * | 10/1985 | Nakazawa et al. | 361/743 |
| 5,020,149 A | * | 5/1991 | Hemmie | 455/325 |
| 5,629,495 A | * | 5/1997 | Sumida et al. | 174/12 R |
| 6,002,585 A | * | 12/1999 | Leeb | 361/690 |
| 6,005,768 A | * | 12/1999 | Jo | 361/685 |
| 6,094,349 A | * | 7/2000 | Fassel et al. | 361/704 |
| 6,326,761 B1 | * | 12/2001 | Tareilus | 318/722 |
| 6,341,063 B2 | * | 1/2002 | Kinoshita et al. | 361/690 |
| 6,597,578 B2 | * | 7/2003 | Shiina et al. | 361/728 |
| 6,702,593 B2 | * | 3/2004 | Ogawa | 439/79 |
| 6,740,809 B2 | * | 5/2004 | Vacheron | 174/50 |
| 6,771,501 B2 | * | 8/2004 | Coleman et al. | 361/700 |
| 6,788,534 B2 | * | 9/2004 | Kinoshita et al. | 361/690 |
| 6,853,553 B2 | * | 2/2005 | Seaton et al. | 361/695 |
| 7,182,612 B1 | * | 2/2007 | Immethun | 439/108 |
| 2008/0024009 A1 | * | 1/2008 | Hussaini et al. | 307/26 |

* cited by examiner

*Primary Examiner*—Boris L Chervinsky
(74) *Attorney, Agent, or Firm*—Squire, Sanders & Dempsey, L.L.P.

(57) ABSTRACT

A circuit board assembly comprises a circuit board having a connector or contact pad, and a housing. The housing includes a casing having an open end, an end cover sealing the open end of the casing and having a conductor, a coolant inlet for introducing a coolant into the housing, a coolant outlet for discharging the coolant from the housing, an inside connector connected to an inside surface of the conductor of the end cover, and an outside connector connected to an outside surface of conductor. The conductor of the end cover extends from an inside surface of the end cover to an outside surface of the end cover.

26 Claims, 5 Drawing Sheets

(PRIOR ART) Figure 1A

CIRCUIT BOARD HOUSING AND CIRCUIT BOARD ASSEMBLY

This application claims the benefit of U.S. Provisional Patent Application No. 60/731,617, filed Oct. 28, 2005, the entire disclosure of which provisional application is incorporated herein by reference.

FIELD OF THE INVENTION

This invention relates to a housing for cooling a circuit board and to a circuit board assembly.

BACKGROUND OF THE INVENTION

A circuit board, such as a printed circuit board, may be comprised of one or more components, such as high density LSI's, which generate a significant amount of heat during operation. To keep these components from overheating, a cooling system is often employed to cool the components. With such a cooling system, several circuit boards may be densely installed in a small space.

FIGS. 1A, 1B and 1C illustrate a typical cooling system 10. The cooling system 10 includes a housing 12 that is mounted on both sides of a circuit board 14. The cooling system 10 also includes an inlet 16 and an outlet 18, which allow a coolant to enter and exit the housing 12 to cool the circuit board 14.

The housing 12 has an open side face 20 on which the circuit board 14 is mounted. The housing 12 and circuit board 14 form an enclosed chamber for receiving a coolant. When the coolant is in the chamber, it cools the circuit board 14. The housing 12 has a flange 22 on which the circuit board 14 is sealingly attached using screws 24 or using bolts and nuts. Typically, an O-ring seal 25 is placed in a groove (not shown) on the face of the housing flange 22. When the circuit board 14 is mounted on the face of the housing flange 22, the O-ring seal 25 is compressed against a smooth surface of the circuit board 14 to seal the gap between the housing flange 22 and the circuit board 14. The smooth surface of the circuit board 14 is generally provided by a metallic sheet that is attached to the circuit board by, for example, screws (not shown).

In some cases, only one side of a circuit board may be attached to a housing so that only one side of the circuit board comes in contact with the coolant. The housing may be attached to the circuit board in the manner shown in FIGS. 1A, 1B and 1C.

The prior art cooling system 10 shown in FIGS. 1A, 1B and 1C has several disadvantages. First, the connectors 26 of the circuit board 14 are not cooled by the cooling system 10. Because the housing 12 of the cooling system 10 is attached to a side of the circuit board 14, the connectors 26 of the circuit board 14 are outside of the housing 12 of the cooling system 10. Since the connectors 26 of the circuit board 14 generate considerable heat, not cooling the connectors 26 is a significant disadvantage. Second, because of the need for space on the circuit board 14 to accommodate the smooth surface for the O-ring seal, a circuit board with the smooth surface is made larger. In addition, the circuit board 14 must have space to accommodate the screws 24 for attaching the housing 12 to the circuit board 14, further increasing the size of the circuit board 14. Third, the O-ring circles the entire open face 20 of the housing 12 and thus is longer and more prone to leakage.

SUMMARY OF THE INVENTION

The present invention is developed, in part, to overcome at least some of the advantages associated with prior art cooling systems.

In accordance with one aspect of the invention, a housing for cooling a circuit board comprises a casing having an open end, an end cover sealing the open end of the casing and having a conductor, a coolant inlet for introducing a coolant into the housing, a coolant outlet for discharging the coolant from the housing, an inside connector connected to an inside surface of the conductor of the end cover, and an outside connector connected to an outer surface of conductor. The conductor of the end cover extends from an inside surface of the end cover to an outer surface of the end cover.

According to a preferred embodiment of this aspect of the invention, the casing and end cover are designed to sealingly enclose the entire circuit board.

According to another preferred embodiment of this aspect of the invention, the inside connector is designed to be connected to a connector or contact pad of the circuit board.

In accordance with another aspect of the invention, a circuit board assembly comprises a circuit board and a sealed housing for accommodating the circuit board. The circuit board is completely enclosed in the sealed housing. The housing includes a coolant inlet for introducing a coolant into the housing and a coolant outlet for discharging the coolant from the housing.

According to a preferred embodiment of this aspect of the invention, the housing includes a casing including an open end, and an end cover sealing the open end of the casing. The end cover includes a conductor extending from an inside surface of the end cover to an outer surface of the end cover.

According to another preferred embodiment of this aspect of the invention, the housing includes an inside connector connected to an inside surface of the conductor, and an outside connector connected to an outer surface of conductor.

According to a further preferred embodiment of this aspect of the invention, the circuit board includes a connector or contact pad connected to the inside connector.

In accordance with a further aspect of the invention, a circuit board assembly comprises a circuit board having a connector or contact pad, and a housing. The housing includes a casing having an open end, an end cover sealing the open end of the casing and having a conductor, a coolant inlet for introducing a coolant into the housing, a coolant outlet for discharging the coolant from the housing, an inside connector connected to an inside surface of the conductor of the end cover, and an outside connector connected to an outer surface of conductor. The conductor of the end cover extends from an inside surface of the end cover to an outer surface of the end cover.

According to a preferred embodiment of this aspect of the invention, the inside connector is connected to the connector or contact pad of the circuit board.

In some embodiments of the present invention, the casing includes a second open end, and the housing includes a second end cover sealing the second open end of the casing. The second end cover may include a conductor extending from an inside surface of the second end cover to an outer surface of the second end cover. Preferably, the housing includes a second inside connector connected to an inside surface of the conductor of the second end cover, and a second outside connector connected to an outer surface of the conductor of the second end cover. The second inside connector may be connected to a connector or contact pad of the circuit board.

The coolant inlet may be placed on the first end cover, and the coolant outlet may be placed on the second end cover. Alternatively, the coolant inlet and coolant outlet may be placed on one end cover.

The present invention has various advantages. First, in accordance to one aspect of the invention, the circuit board is completely encased in a housing. As a result, the entire circuit board, including the connectors, is cooled by the coolant. In the prior art embodiment shown in FIGS. 1A, 1B and 1C, the connectors 26 of the circuit board 14 are outside of the housing 12 of the cooling system 10 and thus are not cooled. Second, in accordance to another aspect of the invention, the housing of the cooling system is not sealed against the circuit board. Thus, there is no need for space on the circuit board to accommodate the smooth surface for the O-ring seal, and the circuit board can be made smaller. In addition, unlike the prior art shown in FIGS. 1A, 1B and 1C, there is no need on the circuit board for space to accommodate the screws for attaching the housing to the circuit board, further reducing the size of the circuit board. Third, in accordance with a further aspect of the invention, an O-ring seal is needed to seal only an end cover of the housing to the casing of the housing. As a result, the O-ring seal can be smaller than the O-ring seal used in the prior art embodiment shown in FIGS. 1A, 1B and 1C where the O-ring seal circles the entire housing and thus is longer and more prone to leakage.

BRIEF DESCRIPTION OF THE DRAWINGS

FIG. 1A shows an elevation view of a prior art circuit board assembly.

DETAILED DESCRIPTION OF PREFERRED EMBODIMENTS

Figure 2:
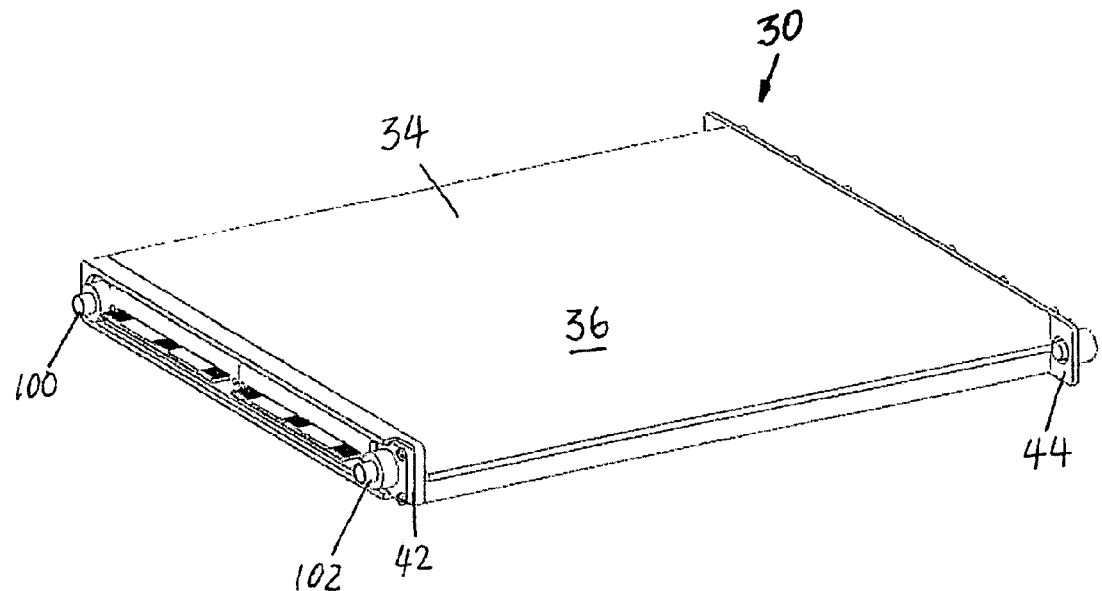
FIG. 2 shows a perspective view of a circuit board assembly of the present invention.
Figure 3:
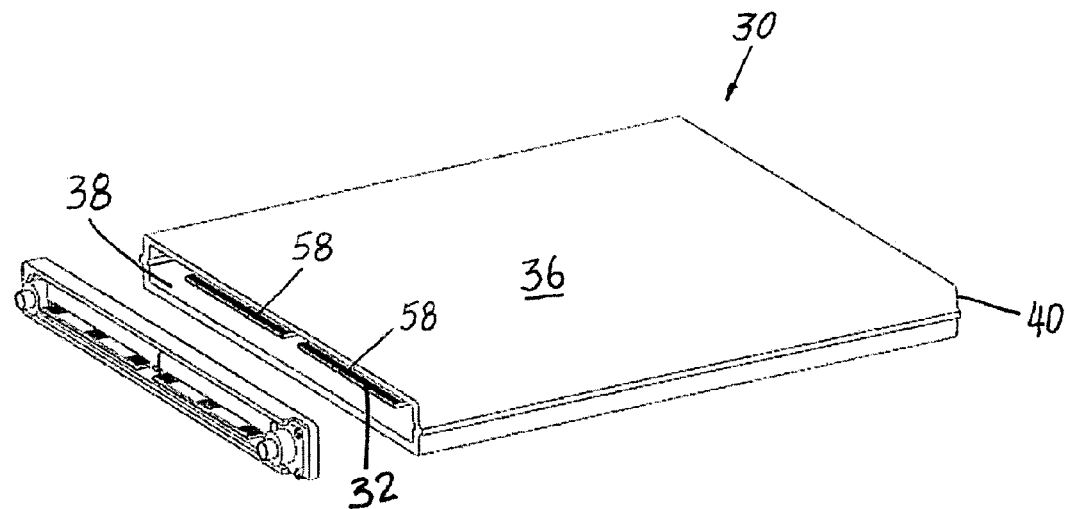
FIG. 3 shows a perspective view of the circuit board assembly of FIG. 2 in a disassembled state.

FIG. 2 illustrate an exemplary circuit board assembly 30 of the present invention. The circuit board assembly 30 includes a circuit board 32 (FIG. 3) and a housing 34 for accommodating the circuit board 32. As shown in FIG. 3, the housing 34 includes a casing 36 with two open ends 38, 40, and an end cover 42, 44 (FIG. 4) sealingly attached to each open end 38, 40 of the casing 36 to form a sealed housing 34. The end covers 42, 44 can be attached to the casing 36 in any suitable manner. For example, the end covers 42, 44 can be welded, glued, or soldered to the casing 36. Alternatively, the end covers 42, 44 can be attached to the casing 36 using a mechanical device, such as screws, rivets, or a bracket.

As shown in FIG. 3 the casing 36 is used to accommodate the circuit board 32. The casing 36 has a generally parallelepiped configuration and can be made from any suitable material, such as a plastic material or a metallic material. In some embodiments, the casing 36 is made from extruded aluminum. Although the illustrated casing 36 has two open ends, a casing of the present invention may have only one open end or more than two open ends.

Figure 4:
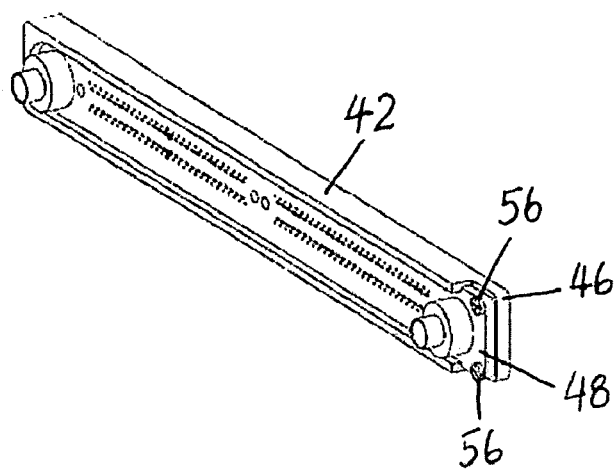
FIG. 4 shows an end cover of the circuit board assembly of FIG. 2.
Figure 5:
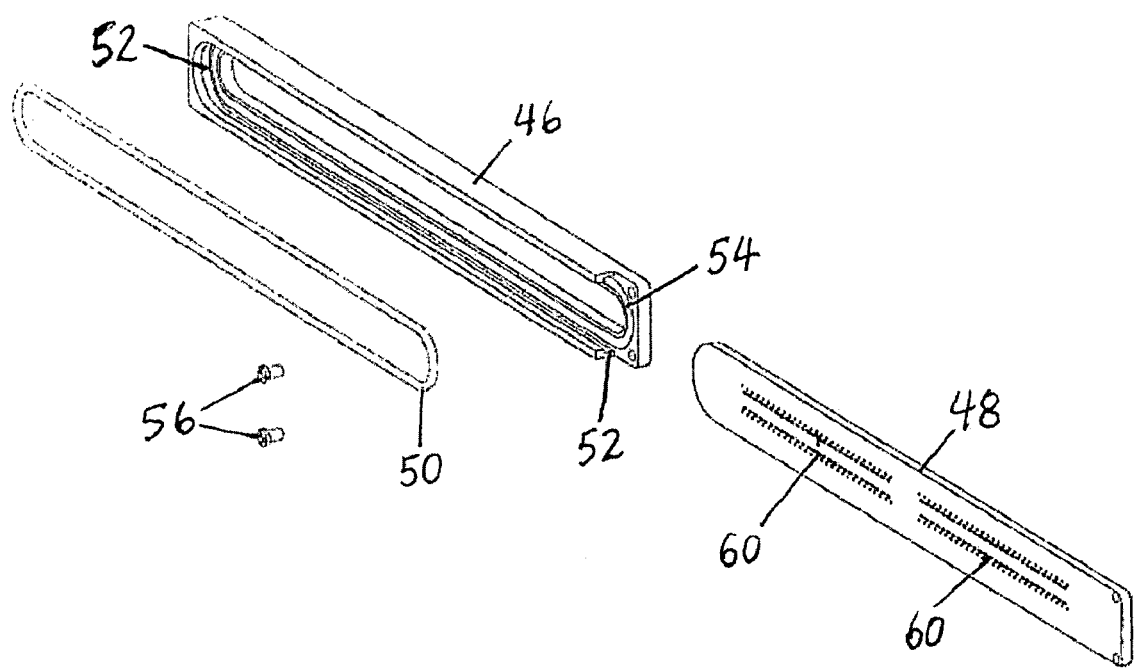
FIG. 5 shows the end cover of FIG. 4 in a disassembled state.

As shown in FIGS. 4 and 5, the end cover 42 preferably includes a holder 46, a plate 48, and an O-ring seal 50 disposed between the holder 46 and the plate 48. Alternatively, the end cover may include a plate without the holder 46 and O-ring seal 50, and the plate can be directly attached to the casing 36. In the illustrated embodiment, the holder 46 is attached to an open end 38 of the casing 36. The plate 48 can be slid into a groove 52 of the holder 46 to form the end cover 42. Preferably, the holder 46 has a seal groove 54 for receiving the O-ring seal 50. When the plate 48 is slid into the groove 52 of the holder 46, the O-ring seal 50 is compressed between the holder 46 and the plate 48 to seal the gap between the holder 46 and plate 48. The plate 48 then can be attached to the holder 46 with screws 56. Alternatively, the plate 48 can be welded or glued to the holder 46. In the illustrated embodiment, the circuit board 32 is completely encased in the housing 34. As a result, the entire circuit board 32, including the connectors or contact pads 58, is cooled by the coolant.

Preferably, the plate 48 is made from a material that is an electric insulator, such as a plastic or composite material, or at least is not a good electric conductor. In a preferred embodiment, the plate 48 may be a printed circuit board. The plate 48 includes a number of electric conductors 60 that are sealingly embedded therein. Each conductor 60 extends at least from one surface of the plate 48 to the other surface of the plate 48, so that the conductor 60 can conduct electricity from one surface of the plate 48 to the other surface of the plate 48.

Figure 6:
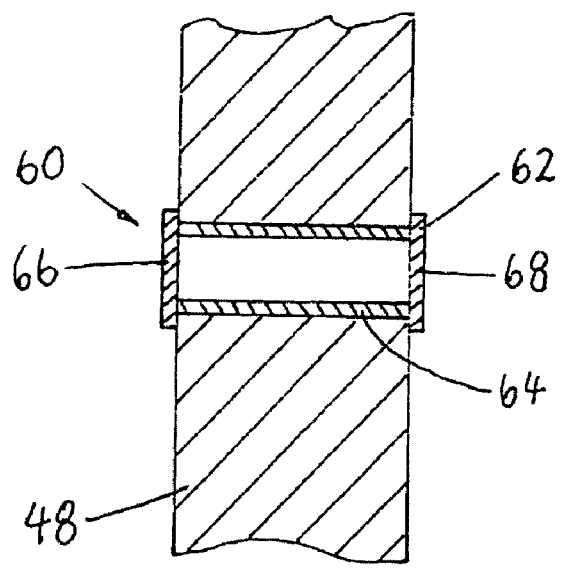
FIG. 6 shows a conductor embedded in a plate of the end cover of FIG. 4.

Each conductor 60 embedded in the plate 48 may be of any suitable configuration, such as a cubic or cylindrical configuration. In the illustrated embodiment, as shown in FIG. 6, each conductor 60 may be a blind via 62. Each blind via 62 includes a hollow cylinder 64 that is embedded in the plate 48 and extends from one surface of the plate 48 to the other surface. The hollow cylinder 64 may be filled with a material, such as a material that is the same as or similar to the material from which the plate 48 is made. This material can be a material for a printed circuit board. Each via 62 includes also two pads 66, 68. One pad 66 is attached to one end of the cylinder 64 and the other pad 68 to the other end of the cylinder 64. Each pad 66, 68 rests against the corresponding surface of the plate 48. Each pad may be configured in various manners. For example, the pad may have the configuration of a disk. Alternatively, the pad may have an elongated configuration. Additionally, the pad may be connected to one or more other components on the plate which may be a printed circuit board.

Figure 7:
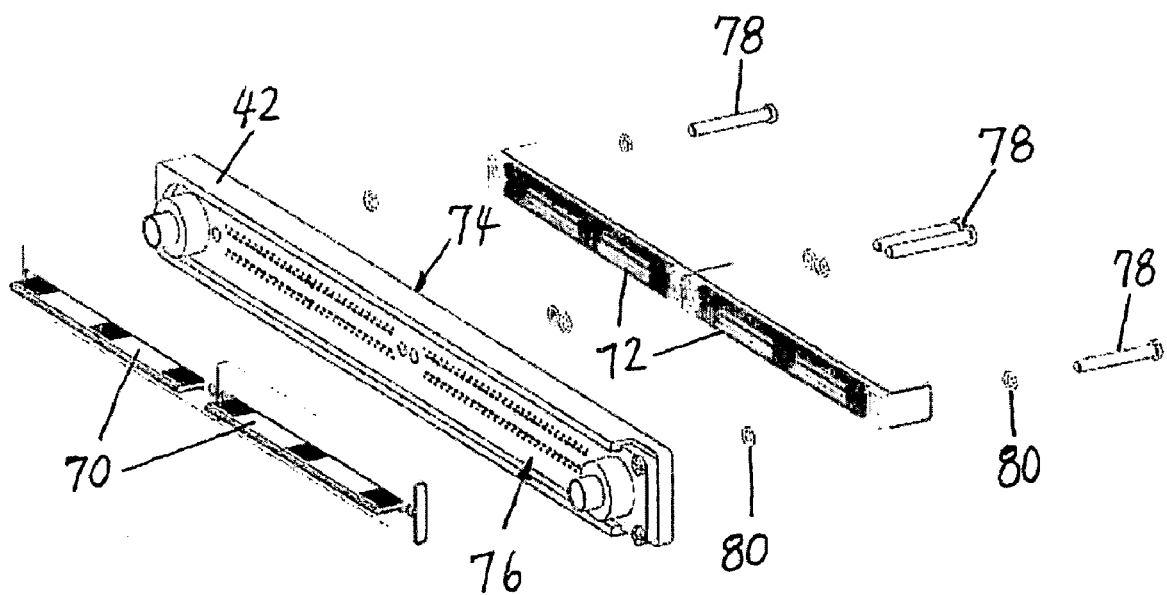
FIG. 7 shows an outside connector and an inside connector of the circuit board assembly of FIG. 2.

As shown in FIG. 7, the housing 34 of the illustrated embodiment includes two outside connectors 70 and two inside connectors 72, although the housing 34 may include any number of outside connectors 70 and any number of inside connectors 72, including only one outside connector 70 and one inside connector 72. The number of outside connectors 70 does not need to be equal to the number of inside connectors 72. Although in the illustrated embodiment each outside connector 70 is a mail connector and each inside connector 72 is a female connector, each outside connector can also be a female connector and each inside connector can also be a male connector.

Each of the outside and inside connectors 70, 72 may be attached to the end cover 42. In the illustrated embodiment, as shown in FIG. 7, each inside connector 72 may be attached to the inside surface 74 of the end cover 42, and each outside connector 70 may be attached to the outside surface 76 of the end cover 42. The outside and inside connectors 70, 72 may be attached to the end cover 42 in any suitable manner. For example, as shown in FIG. 7, long screws 78 are used to attach the outside and inside connectors 70, 72 to the end cover 42. Each screw 78 extends through an inside connector 72 and the end cover 42 and is screwed onto an outside connector 70. O-ring seals 80 are provided to prevent leakage through the holes for the screws 78.

Figure 8:
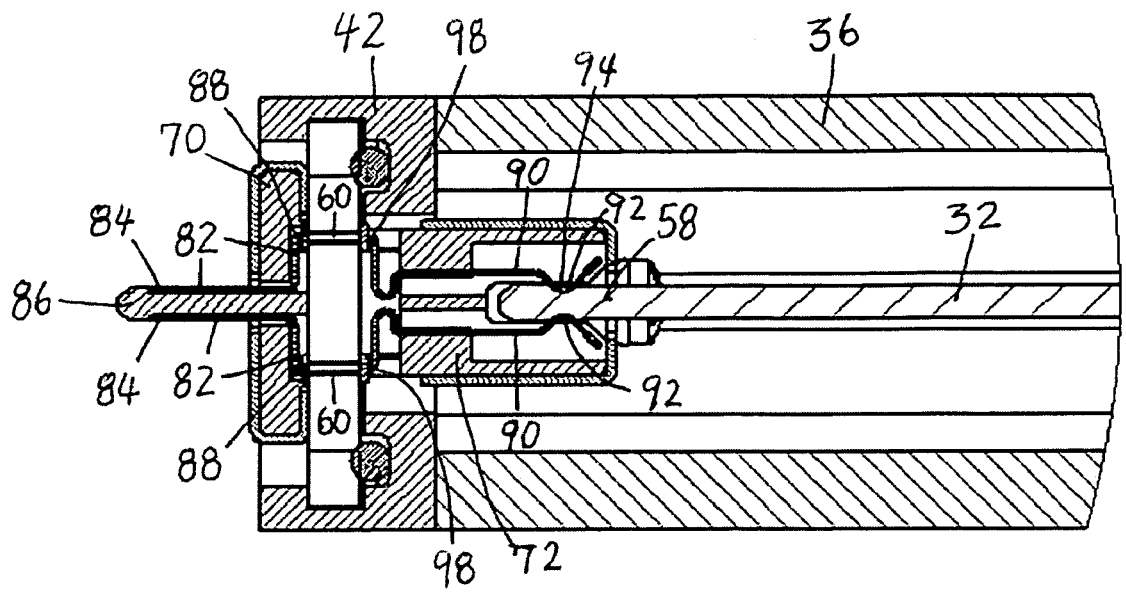
FIG. 8 shows a cross-sectional view of an outside connector and an inside connector, both being attached to a plate of an end cover

As shown in FIG. 8, each outside connector 70 includes a number of contact wires 82. One end 84 of each contact wire 82 rests on the tongue 86 of the outside connector 70, and other end 88 of each contact wire 82 is attached to the outside surface of a conductor 60 (i.e., the outside pad 66 of a via 62). The contact wire 82 can be attached to the outside surface of the conductor 60 in any suitable manner. For example, the contact wire 82 can be compressed, welded or soldered on the outside surface of the conductor 60.

Each inside connector 72 also includes a number of contact wires 90. The first end 92 of each contact wire 90 forms a contact point 94 for contacting a circuit board's male connectors or contact pads 58. The other end 98 of each contact wire 90 is attached to the inside surface of a conductor 60 (i.e., the inside pad 68 of a via 62). Each contact wire 90 can be attached to the inside surface of the conductor 60 in any suitable manner. For example, the contact wire 90 can be compressed, welded or soldered on the inside surface of the conductor 60.

An electric current can flow from the male connector or contact pads 58 of the circuit board 32 to a contact wire 90 of the inside connector 72, then through a conductor 60 of the plate 48 of the end cover 42, and finally to a contact wire 82 of the outside connector 70. From the outside connector 70, the electricity can flow into a female connector connected to the male outside connector 70. An electric current can also flow in the opposite direction from the outside connector 70 to the inside connector 72.

The housing 34 may include one or more coolant inlets and one or more coolant outlets. The coolant inlets allow a coolant to flow into the housing 34 to cool the circuit board 32, and the coolant outlet allows the coolant to exit the housing 34. Each coolant inlet or coolant outlet may be provided on any one of the end covers 42, 44, for example. In the illustrated embodiment, as shown in FIGS. 2 and 5, a single coolant inlet 100 and a single coolant outlet 102 are provided on a single end cover 42.

The second end cover 44 may include a conductor extending from an inside surface of the second end cover 44 to an outer surface of the second end cover 44. Preferably, the housing 34 includes a second inside connector connected to an inside surface of the conductor of the second end cover 44, and a second outside connector connected to an outer surface of the conductor of the second end cover 44. The second inside connector may be connected to a connector or contact pad of the circuit board 32. These conductors, inside and outside connectors and coolant inlet and outlet, which are discussed here in connection with the second end cover 44, are identical to those discussed in connection with the first end cover 42 and are shown in FIGS. 4-7.

Figure 9:
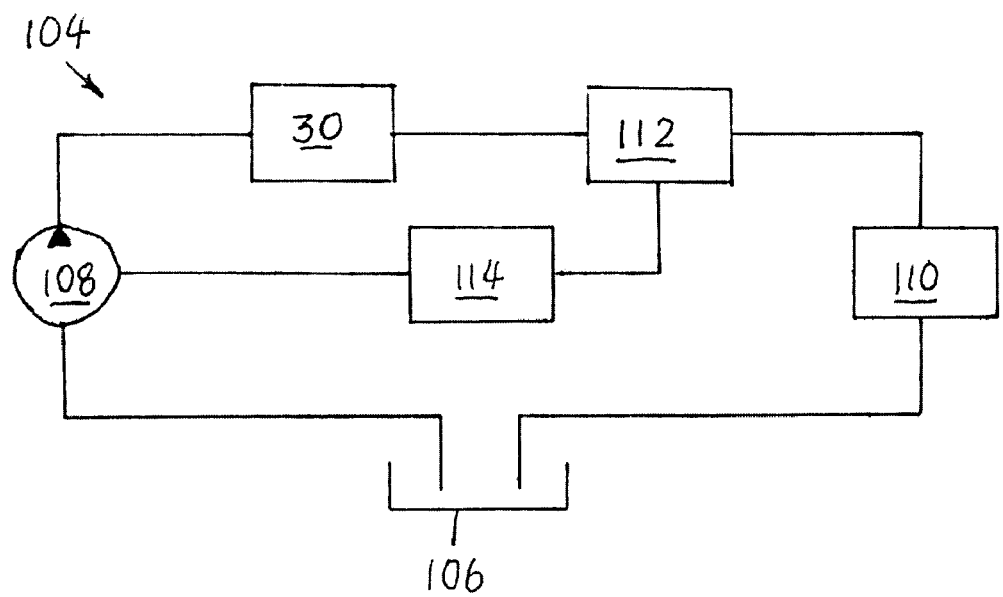
FIG. 9 shows a coolant circuit for supplying a coolant to the circuit board assembly of FIG. 2.

FIG. 9 illustrates a system 104 for providing a coolant to the circuit board assembly 30. The coolant preferably is a liquid, although it can be any suitable fluid. The system 104 may include a reservoir 106 for storing a coolant, a pump 108 for supplying the coolant to the circuit board assembly 30, and a heat exchanger 110 for cooling the coolant from the circuit board assembly 30 before it is returned to the reservoir 106. The system 104 may also include a temperature sensor 112 for sensing the temperature of the coolant inside the circuit board assembly 30, and a controller 114 that receives a coolant temperature signal from the temperature sensor 112 and controls the coolant temperature at a desired value by adjusting, for example, the rate of flow through the circuit board assembly 30. The flow rate through the circuit board assembly 30 can be adjusted by, for example, varying the output of the pump 108. The temperature sensor 112 may also be used to sense the temperature of the coolant exiting the circuit board assembly 30 or the temperature of any component of the circuit board assembly 30. The temperature sensor 112 can be incorporated into the circuit board assembly 30, or it can be a stand alone temperature sensor.

Figure 1B:
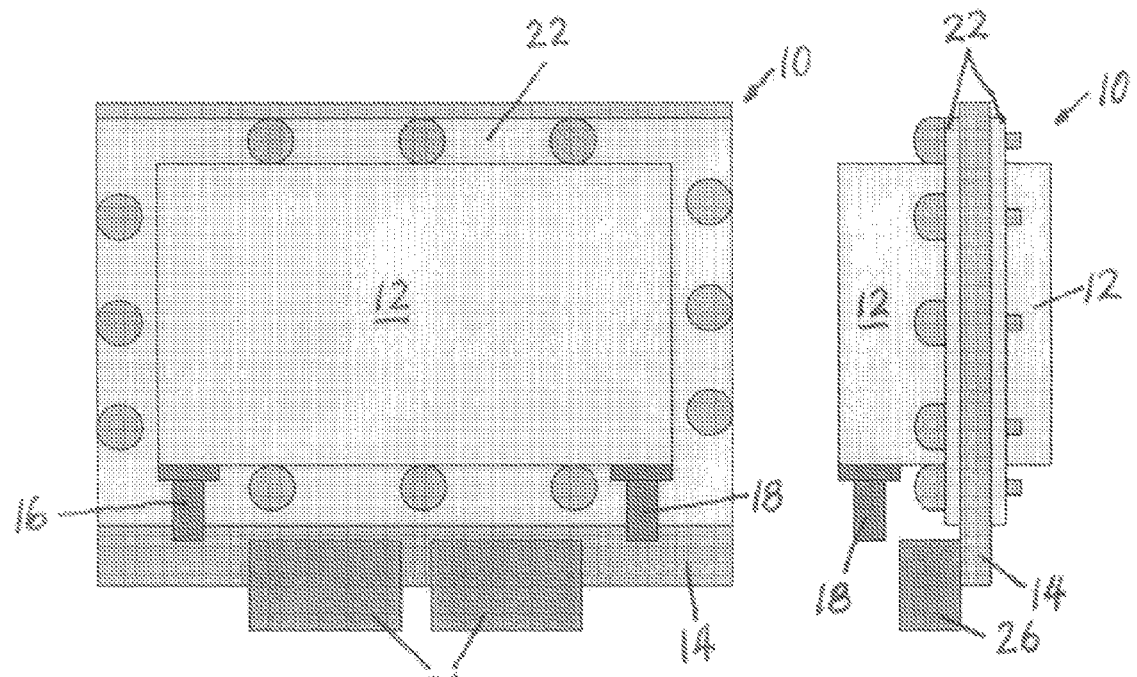
FIG. 1B shows a side view of the prior art circuit board assembly of FIG. 1A.
Figure 1C:
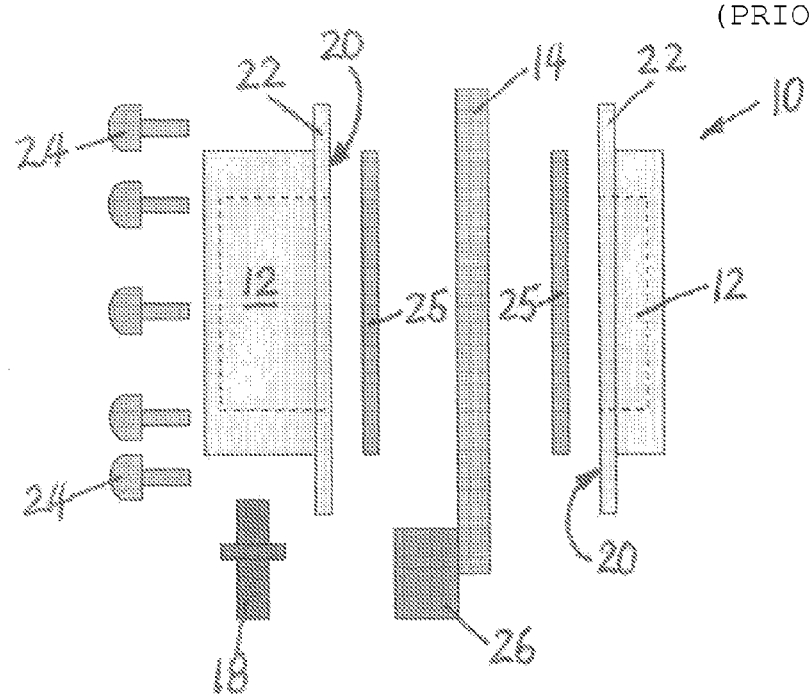
FIG. 1C shows a side view of the prior art circuit board assembly of FIG. 1A in a disassembled state.

In the illustrated embodiment of the present invention, the circuit board 32 is completely encased in a housing 34. As a result, the entire circuit board 32, including the connectors or contact pads 58, is cooled by the coolant. Additionally, both the outside and inside connectors are cooled. As a result, little heat is transferred to the device connected to the circuit board assembly 30 (i.e., the device connected to the outside connectors 70 of the circuit board assembly 30). In the prior art embodiment shown in FIGS. 1A, 1B and 1C, the connectors 26 of the circuit board 14 are outside of the housing 12 of the cooling system 10 and thus are not cooled, and a significant amount of heat is transferred to the device connected to a connector 26 of the circuit board 14.

While a preferred embodiment of the present invention is disclosed, it is to be understood that the concepts of the present invention are susceptible to numerous changes apparent to one skilled in the art. Therefore, the scope of the present invention is not to be limited to the details shown and described but is intended to include all variations and modifications which come within the scope of the appended claims.

The invention claimed is:

1. A circuit board assembly, comprising:
   a circuit board; and
   a sealed housing for accommodating the circuit board, the circuit board being completely enclosed in the sealed housing, wherein the housing includes
      a coolant inlet for introducing a coolant into the housing,
      a coolant outlet for discharging the coolant from the housing,
      a casing including an open end,
      an end cover sealing the open end of the casing, the end cover including
         a conductor extending from an inside surface of the end cover to an outside surface of the end cover, and
         a printed circuit board, wherein the conductor includes a blind via.

2. The circuit board assembly of claim 1, wherein the housing includes
   an inside connector connected to an inside surface of the conductor; and
   an outside connector connected to an outside surface of conductor.

3. The circuit board assembly of claim 2, wherein the circuit board includes a connector or contact pad connected to the inside connector.

4. The circuit board assembly of claim 2, wherein the casing including a second open end, and wherein the housing includes a second end cover sealing the second open end of the casing.

5. The circuit board assembly of claim 4, wherein the second end cover includes a conductor extending from an inside surface of the second end cover to an outside surface of the second end cover.

6. The circuit board assembly of claim 5, wherein the housing includes
   a second inside connector connected to an inside surface of the conductor of the second end cover; and
   a second outside connector connected to an outside surface of the conductor of the second end cover.

7. The circuit board assembly of claim 6, wherein the circuit board includes a connector or contact pad connected to the second inside connector.

8. The circuit board assembly of claim 4, wherein the coolant inlet is placed on the first end cover, and the coolant outlet is placed on the second end cover.

9. The circuit board assembly of claim 1, wherein the coolant inlet and coolant outlet are placed on the end cover.

10. A housing for cooling a circuit board, comprising:
    a casing for accommodating a circuit board, wherein the casing includes an open end;
    an end cover sealing the open end of the casing, wherein the end cover includes
       a conductor extending from an inside surface of the end cover to an outside surface of the end cover, and
       a printed circuit board, wherein the conductor includes a blind via;
    a coolant inlet for introducing a coolant into the housing;
    a coolant outlet for discharging the coolant from the housing;
    an inside connector connected to an inside surface of the conductor; and
    an outside connector connected to an outside surface of conductor.

11. The housing of claim 10, wherein the casing and end cover are designed to sealingly enclose the entire circuit board.

12. The housing of claim 10, wherein the inside connector is designed to be connected to a connector or contact pad of the circuit board.

13. The housing of claim 10, wherein the casing including a second open end, and wherein the housing includes a second end cover sealing the second open end of the casing.

14. The housing of claim 13, wherein the second end cover includes a conductor extending from an inside surface of the second end cover to an outside surface of the second end cover.

15. The housing of claim 14, wherein the housing includes
    a second inside connector connected to an inside surface of the conductor of the second end cover; and
    a second outside connector connected to an outside surface of the conductor of the second end cover.

16. The housing of claim 15, wherein the second inside connector is designed to be connected to a connector or contact pad of the circuit board.

17. The housing of claim 13, wherein the coolant inlet is placed on the first end cover, and the coolant outlet is placed on the second end cover.

18. The housing of claim 10, wherein the coolant inlet and coolant outlet are placed on the end cover.

19. A circuit board assembly comprising:
    a circuit board having a connector or contact pad; and
    a housing including
       a casing for accommodating the circuit board, wherein the casing includes an open end,
       an end cover sealing the open end of the casing, wherein the end cover includes a conductor extending from an inside surface of the end cover to an outside surface of the end cover, and wherein the end cover includes a printed circuit board and the conductor includes a blind via,
       a coolant inlet for introducing a coolant into the housing,
       a coolant outlet for discharging the coolant from the housing,
       an inside connector connected to an inside surface of the conductor, and
       an outside connector connected to an outside surface of conductor.

20. The circuit board assembly of claim 19, wherein the inside connector is connected to the connector or contact pad of the circuit board.

21. The circuit board assembly of claim 19, wherein the casing including a second open end, and wherein the housing includes a second end cover sealing the second open end of the casing.

22. The circuit board assembly of claim 21, wherein the second end cover includes a conductor extending from an inside surface of the second end cover to an outside surface of the second end cover.

23. The circuit board assembly of claim 22, wherein the housing includes
    a second inside connector connected to an inside surface of the conductor of the second end cover; and
    a second outside connector connected to an outside surface of the conductor of the second end cover.

24. The circuit board assembly of claim 23, wherein the second inside connector is connected to the connector or contact pad of the circuit board.

25. The circuit board assembly of claim 21, wherein the coolant inlet is placed on the first end cover, and the coolant outlet is placed on the second end cover.

26. The circuit board assembly of claim 19, wherein the coolant inlet and coolant outlet are placed on the end cover.

* * * * *